(12) United States Patent
Eshun

(10) Patent No.: US 7,145,218 B2
(45) Date of Patent: Dec. 5, 2006

(54) THIN-FILM RESISTOR AND METHOD OF MANUFACTURING THE SAME

(75) Inventor: Ebenezer E. Eshun, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 5 days.

(21) Appl. No.: 10/709,692

(22) Filed: May 24, 2004

(65) Prior Publication Data

US 2005/0258513 A1 Nov. 24, 2005

(51) Int. Cl.
 *H01L 29/00* (2006.01)
(52) U.S. Cl. ................. 257/537; 257/536; 257/E27.035
(58) Field of Classification Search ................. 257/536, 257/537, 539, 581, 154, 363, 379, E27.035, 257/E27.047, E27.071, 359; 338/204, 205, 338/309, 313, 314

See application file for complete search history.

(56) References Cited

U.S. PATENT DOCUMENTS

| | | | | |
|---|---|---|---|---|
| 3,601,889 A | * | 8/1971 | Kaneoya et al. | ............... 29/620 |
| 6,144,287 A | * | 11/2000 | Komeda | ..................... 338/195 |
| 2002/0020879 A1 | * | 2/2002 | Shiiki et al. | ................ 257/359 |

* cited by examiner

*Primary Examiner*—Kenneth Parker
*Assistant Examiner*—Matthew C Landau
(74) *Attorney, Agent, or Firm*—Anthony J. Canale

(57) ABSTRACT

The invention relates to integration of a thin-film resistor in a wiring level, such as, for example, an aluminum back-end-of-line (BEOL) technology. The thin-film resistor is formed in a wiring level on, for example, an upper surface of a dielectric layer. The thin-film resistor includes end portions tapered at an angle less than 90 degrees with respect to the upper surface. The tapered end portions provide increased surface area for making contact to the thin-film resistor without adversely affecting the resistance value of the thin-film resistor.

5 Claims, 2 Drawing Sheets

THIN-FILM RESISTOR AND METHOD OF MANUFACTURING THE SAME

BACKGROUND OF INVENTION

1. Field of the Invention

The invention relates to semiconductor processing. More specifically, the invention relates to integration of a thin-film resistor in a wiring level.

2. Background of the Invention

Metal resistors integrated in the back-end-of-line (BEOL) are critical for radio frequency (RF) circuits requiring small resistance tolerances and low parasitic capacitance. Tantalum nitride (TaN) is commonly used as a thin-film resistor in copper (Cu) BEOL technology since TaN thin films can be relatively easily integrated in the Cu BEOL. Cu interconnects are formed by damascene processes known in the art including forming a trough in a dielectric layer (i.e. silicon oxide), forming a layer of Cu in the trough, and chemical-mechanical polishing (CMP) to remove excess Cu from the dielectric layer. Thin-film resistors can be formed immediately after the CMP step since a planar surface is provided for the thin-film resistor to be formed upon. Also, the thin-film resistor is typically formed in close proximity to an interconnect so the same via can be used to contact both the thin-film resistor and the interconnect. Thus, conventional process integration adds only one photolithographic masking step to form the thin-film resistor in Cu BEOL.

In aluminum BEOL technology, a subtractive etch process is typically used to form aluminum interconnects in a wiring level on a semiconductor substrate. A layer of aluminum is formed on an upper surface of a dielectric layer such as, silicon oxide, and is patterned by a photolithographic process. Exposed aluminum is removed by an etch process such as reactive ion etching to form aluminum interconnects on the upper surface of the dielectric layer. The formation of aluminum interconnects by a subtractive etch process results in topography in the wiring level.

To obtain a planar surface on an aluminum wiring level, a second dielectric layer is formed over the aluminum interconnects and planarized to form a planar surface. Another requirement for the thin-film resistor is that the resistor should be in close proximity to an interconnect to allow the use of the same via for both the resistor and the interconnect. The thickness of the second dielectric layer required to form a planar surface results in the thin-film resistor being located a relatively large distance from an interconnect such that a common via cannot be used for both the thin-film resistor and the interconnect.

Thus, the topography associated with a wiring level in aluminum BEOL technology increases the process complexity and costs required to integrate a thin-film resistor.

BRIEF DESCRIPTION OF DRAWINGS

The foregoing and other features of the invention will become more apparent upon review of the detailed description of the invention as rendered below. In the description to follow, reference will be made to the several figures of the accompanying Drawing, in which.

DETAILED DESCRIPTION

Figure 1:
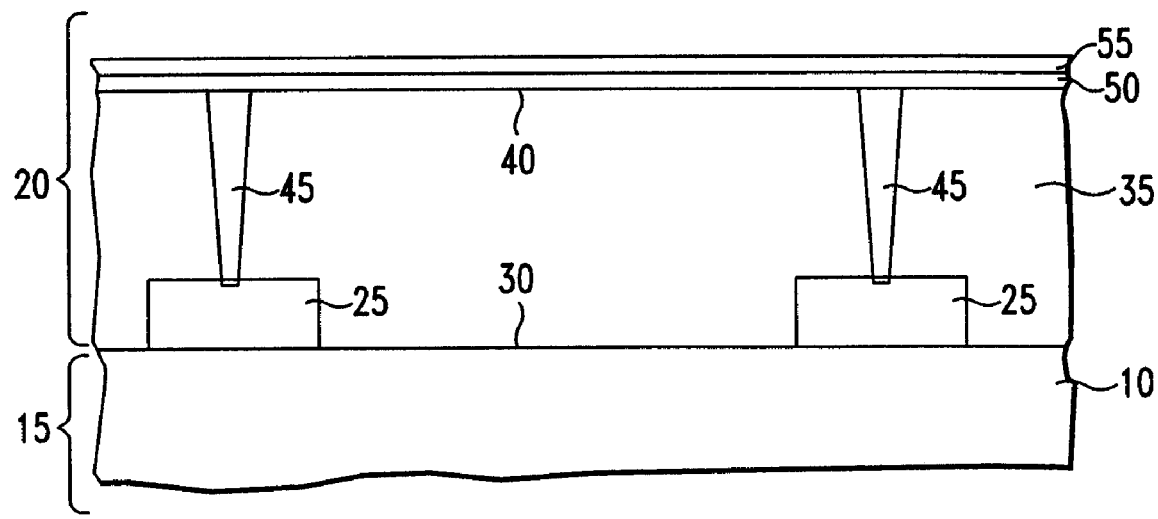
FIGS. 1–4 illustrate process steps to form a thin-film resistor according to an embodiment of the invention.

Referring to FIG. 1, a substrate 10 is provided including front-end-of-line (FEOL) levels 15 and BEOL levels 20 formed thereupon. Preferably, substrate 10 comprises a semiconductor material such as, for example, silicon, silicon-on-insulator (SOI), silicon-germanium (SiGe), or gallium arsenide (GaAs). FEOL levels 15 (not shown in detail) include devices such as, for example, transistors (i.e. field effect, bipolar junction), capacitors, resistors, diodes, varactors, and the like which are connected by interconnects in subsequently formed BEOL levels 20 to form an integrated circuit. Aluminum interconnects 25 are formed on an upper surface 30 of a lower level dielectric layer by methods known in the art such as, for example, a subtractive etch process. A dielectric layer 35 is then formed on interconnects 25 and upper surface 30. Preferably, dielectric layer 35 comprises silicon oxide and can be formed by a process known in the art such as, for example, chemical vapor deposition (CVD). Dielectric layer 35 is sufficiently thick such that after a planarization process (i.e. CMP), upper surface 40 is substantially planar so that subsequent BEOL levels can be formed on a planar upper surface 40. Vias 45 are formed by methods known in the art such as patterning and etching dielectric layer 35 to form a via hole and subsequently filling the hole with a conductor in contact with interconnect 25. The conductor can be selected from the group including, for example, tungsten (W), titanium (Ti) or titanium nitride (TiN).

Still referring to FIG. 1, layers 50, 55 are formed on upper surface 40 by processes known in the art such as CVD or sputter deposition. Layer 50 comprises a thin-film of an electrically resistive material such as, for example, TaN. A portion of layer 50 forms the thin-film resistor described hereinafter. Layer 55 is formed on layer 50 and comprises an electrically insulating material such as, for example, silicon nitride. Silicon nitride layer 55 behaves as an etch stop and prevents TaN layer 50 from being etched in a subsequent etch process.

Figure 2:
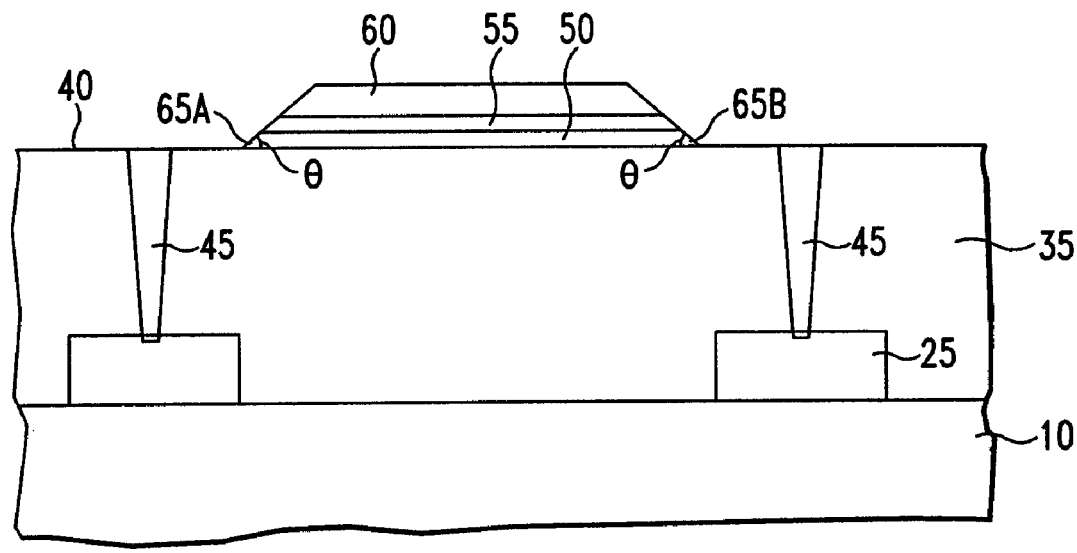

FIG. 2 illustrates the formation of angled portions on TaN layer 50 according to an embodiment of the invention. Preferably, a thickness of TaN layer 50 is from about 45 nanometers (nm) to about 55 nm, and a thickness of silicon nitride layer 55 is from about 65 nm to about 75 nm. A masking layer 60 is patterned on layer 55. Preferably, masking layer 60 comprises a photoresist having a thickness of about 980 nm and is patterned using conventional photolithographic expose and develop techniques. It is noted that masking layer 60 is initially formed having substantially vertical sidewall profiles (not shown). Exposed portions of layers 50, 55 are removed by an etch process such as, for example, a reactive ion etch resulting in angled end portions 65A, 65B having an angle theta with respect to upper surface 40. The reactive ion etch process can be performed on etch systems which are commercially available using processes known in the art that are capable of etching tantalum nitride and silicon nitride films. For example, a reactive ion etch process comprising about 85 sccm $Cl_2$ gas, about 50 sccm $BCl_3$ gas, system temperature of about 70 degrees Celcius, process pressure from about 5 milli-Torr (mT) to about 11 mTorr and RF power from about 350 Watts to about 450 Watts is preferred. After the removal of the exposed portions of layers 50, 55, any remaining portions of photoresist layer 60 can be removed by an oxygen ash.

Angle theta is preferably between about 20 degrees to about 70 degrees; more preferably, angle theta is between about 40 degrees to about 50 degrees. Angled end portions 60A, 60B provide an increased surface area for subsequent contact to the thin-film resistor as discussed herein below. Angle theta is dependent upon, for example, the thicknesses of photoresist layer 60 and silicon nitride layer 55, and the etch process. For example, increasing the thickness of photoresist layer 60 increases the angle theta. Likewise, increasing the thickness of silicon nitride layer 55 increases the angle theta. Adding nitrogen gas to the reactive ion etch process described herein above will decrease the angle theta. Each of the variables (thickness, etch process) can be varied either alone or in combination to achieve a desired value for the angle theta.

Figure 3:
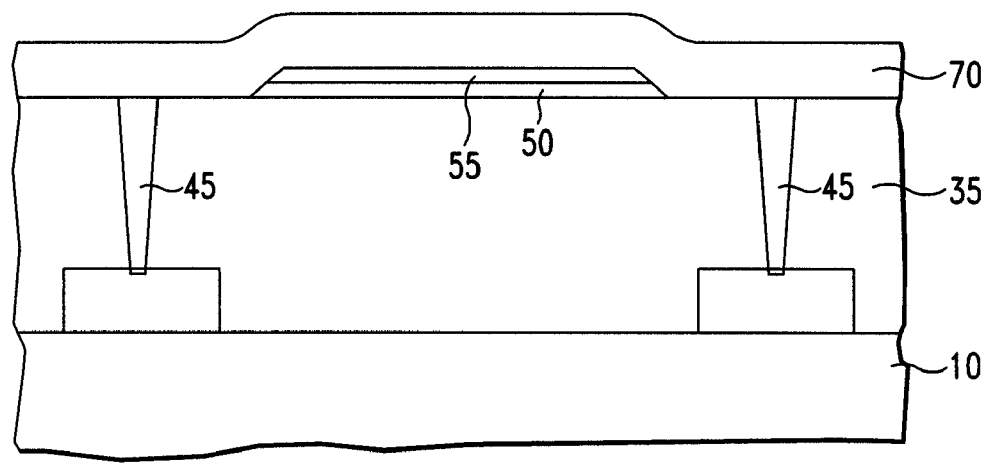
Figure 4A:
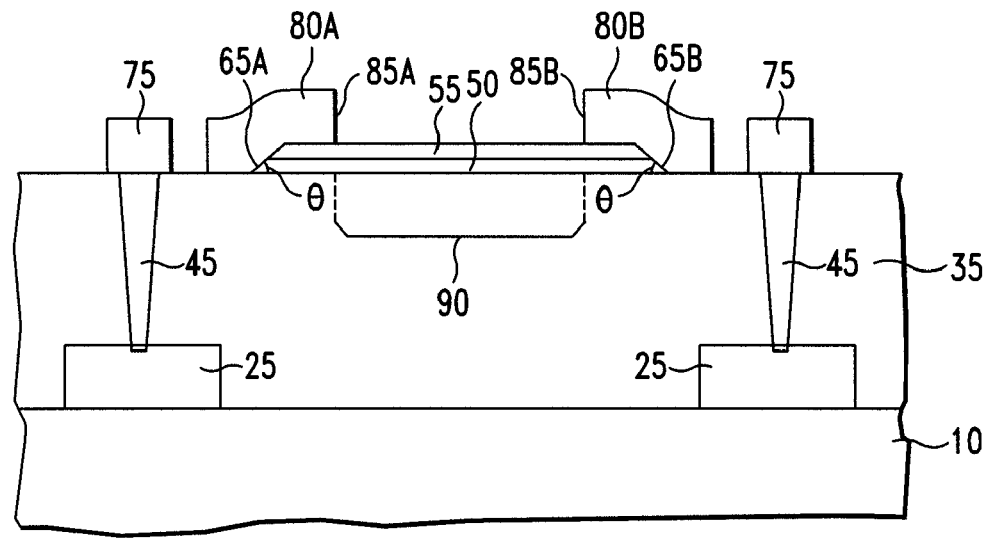

Referring to FIG. 3, a conductive layer 70 such as, for example, a layer of aluminum, is formed on upper surface 40 and layers 50, 55 by a conventional deposition process (i.e. CVD or sputter deposition). Aluminum layer 70 is patterned and portions are removed using photolithographic and etch processes known in the art to form aluminum interconnects 75 and aluminum resistor contacts 80A, 80B as shown in FIG. 4A. Silicon nitride layer 55 prevents etching of TaN layer 50 during the aluminum etch process. Since TaN layer 50 is not etched during the aluminum etch process, thickness variations in TaN layer 50 are minimized resulting in reduced variations in resistance values. Thus, the invention is well suited for the formation of precision resistors that have small resistance tolerances, preferably less than about 10%, more preferably less than about 5%.

Figure 4B:
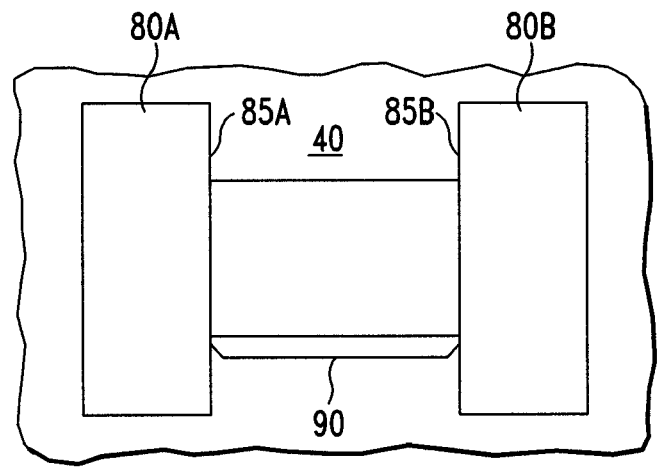

Angled end portions 65A, 65B provide for contact regions that have an increased surface area of TaN layer 50 exposed so that reliable electrical contacts 80A, 80B can be formed. Thin-film resistor 90 is substantially defined by the portion of TaN layer 50 between inner edges 85A, 85B of contacts 80A, 80B. Thin-film resistor 90 can be electrically coupled to other circuit structures by, for example, connecting contacts 80A, 80B with interconnects (not shown). FIG. 4B illustrates a top view of the thin-film resistor 90 shown in FIG. 4A.

An advantage of the invention is a thin-film resistor, including precision thin-film resistors, can be integrated into existing aluminum BEOL technology without requiring the addition of complex processing steps. Another advantage of the invention is that angled end portions of the thin-film resistor provide for reliable electrical contacts to the thin-film resistor.

While the invention has been described above with reference to preferred embodiments thereof, it is to be understood that the spirit and scope of the invention is not limited thereby. Rather, various modifications may be made to the invention as described above without departing from the overall scope of the invention as described above and as set forth in the several claims appended hereto. For example, layer 50 can include more than one layer of electrically resistive material to form the resistive portion of thin-film resistor 90.

The invention claimed is:

1. A semiconductor structure comprising:
    a substrate comprising a plurality of interconnects formed on an upper surface of an inter-metal dielectric layer; and
    a thin-film resistor comprising a conductor layer formed on the upper surface of said inter-metal dielectric layer and adjacent to a first of said plurality of interconnects, said conductor layer comprising end portions tapered at a constant angle between about 20 degrees to about 70 degrees with respect to the upper surface to provide contact regions; a dielectric layer formed on said conductor layer; and contacts abutting said contact regions to provide for electrical coupling to said thin-film resistor.

2. The structure of claim 1, wherein said conductor layer comprises tantalum nitride.

3. The structure of claim 1, wherein said plurality of interconnects comprise aluminum or aluminum alloys.

4. The structure of claim 1, wherein said dielectric layer comprises silicon nitride.

5. The structure of claim 4, wherein said dielectric layer has a thickness of from about 65 nm to about 75 nm.

\* \* \* \* \*